(12) United States Patent
Ramakrishnan et al.

(10) Patent No.: US 7,730,437 B1
(45) Date of Patent: Jun. 1, 2010

(54) METHOD OF FULL SEMICONDUCTOR CHIP TIMING CLOSURE

(75) Inventors: Purushothaman Ramakrishnan, Bangalore (IN); Pattikad Narayanan Ravindran, Bangalor (IN); Chirakkal Varriam Unnikrishnan, Bangalor (IN); Rakesh Mehrotra, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 426 days.

(21) Appl. No.: 11/256,807

(22) Filed: Oct. 24, 2005

Related U.S. Application Data

(60) Provisional application No. 60/622,647, filed on Oct. 27, 2004.

(51) Int. Cl.
*G06F 17/50* (2006.01)

(52) U.S. Cl. ............................................. 716/6; 716/4

(58) Field of Classification Search ..................... 716/4, 716/6
See application file for complete search history.

(56) References Cited

U.S. PATENT DOCUMENTS

| | | | | |
|---|---|---|---|---|
| 6,230,304 | B1* | 5/2001 | Groeneveld et al. | 716/7 |
| 6,519,749 | B1* | 2/2003 | Chao et al. | 716/9 |
| 6,567,957 | B1* | 5/2003 | Chang et al. | 716/4 |
| 6,567,967 | B2* | 5/2003 | Greidinger et al. | 716/10 |
| 6,845,494 | B2* | 1/2005 | Burks et al. | 716/6 |
| 6,877,139 | B2* | 4/2005 | Daga | 716/1 |
| 7,093,208 | B2* | 8/2006 | Williams et al. | 716/3 |

* cited by examiner

*Primary Examiner*—Jack Chiang
*Assistant Examiner*—Brandon W Bowers

(57) ABSTRACT

A method of full semiconductor chip timing closure includes the steps of determining a system level place and route. Next, a static timing analysis for each of a number of subsystems is performed. Finally, a full chip static timing analysis is performed.

24 Claims, 4 Drawing Sheets

METHOD OF FULL SEMICONDUCTOR CHIP TIMING CLOSURE

RELATED APPLICATIONS

The present invention claims priority on provisional patent application Ser. No. 60/622,647, filed on Oct. 27, 2004, entitled "Technique for Full Chip Timing Closure Without Iteration" and is hereby incorporated by reference.

FIELD OF THE INVENTION

The present invention relates generally to the field of electronic circuits and more particularly to a method of full semiconductor chip timing closure.

BACKGROUND OF THE INVENTION

In conventional design and verification techniques, large hierarchical designs have two stages of timing closure, these are block-level timing closure and full-chip timing closure. In block level timing closure, for each individual block, a user must determine constraints for each block and achieve timing closure after the place and route operation is complete. The constraints for individual blocks are often decided in an ad-hoc manner, by assuming some numbers for input and output delays and giving some margin for top-level net delays. Once all blocks are hardened (i.e. place and route is completed), the blocks are integrated at the top-level. This conventional methodology is shown in FIG. 1, where blocks B1, B2, up to . . . . BN are individual place and route (PNR) blocks. The characteristics of this approach include that it is a bottom up approach, the input arrival times and output required times are numbers assumed at the block level, and the full-chip activities are started after blocks are frozen.

The conventional methodology results in iterations because each block is synthesized without looking into how the block fits into the full chip environment. The block level timing constraints for input setup and output data valid were assumed numbers, derived without taking into account the actual net delays at the top level.

Disadvantages of the conventional approach include that in the conventional approach top-level net delays are not measured accurately since this can be estimated only after top level routing is completed, and the design and verification process is quite iterative and time consuming, and not well suited to automation.

FIG. 2 shows a timing diagram with delay budget for block level design. In FIG. 2 the B1 and B2 timing budgets can not incorporate top level net delays accurately because this is unknown during the initial synthesis and place and route operations. The actual top level net delays may be significantly off from initial estimates causing iterations during full-chip Static Timing Analysis.

It would be desirable to have a design and verification technique for block level design that accurately determines net delays and reduces the number of iterations required.

SUMMARY OF INVENTION

A method of full semiconductor chip timing closure that overcomes these and other problems includes the steps of determining a system level place and route. Next, a static timing analysis for each of a number of subsystems is performed. Finally, a full chip static timing analysis is performed. A physical constraint between the plurality of subsystems may be determined as a result of the system level place and route. A signal integrity fix on the system level place and route may be performed after the system level place and route. A subsystem level place and route for each of the subsystems may be performed before the static timing analysis for each of the subsystems. A resistance-capacitance relationship between traces based on the subsystem level place and route may be performed. A physical synthesis of each of the subsystems may be performed before the subsystem place and route. A logic synthesis for each of the subsystems may be performed before the system level place and route.

In one embodiment, a method of full semiconductor chip timing closure includes the steps of performing a logic synthesis for each of a number of subsystems on a semiconductor chip. A system level place and route is performed next. Then a subsystem level place and route is performed. A resistance-capacitance extraction process for a subsystem may be performed next. A subsystem static timing analysis may be performed after the resistance-capacitance extraction process. An exact top level net delay between each of the subsystems may be derived as part of the system level place and route. A system level signal integrity fix may be performed on the system level place and route. In addition, a system level resistance-capacitance extraction process may also be performed on the system level place and route. A subsystem physical synthesis is performed after the exact top level net delay is derived.

In one embodiment, a method of full semiconductor chip timing closure, includes the steps of performing a system level place and route. Next a subsystem level place and route is performed. A subsystem logic synthesis may be performed before the system level place and route. A signal integrity fix may be performed on the system level place and route. A subsystem physical synthesis may be performed before the subsystem place and route. A static timing analysis for a subsystem may be performed after the subsystem place and route. Once the subsystem static timing analysis is done, it may be determined if a full chip static timing analysis is met.

Using this method a design and verification technique for block level design is provided that accurately determines net delays and reduces the number of iterations required.

DETAILED DESCRIPTION OF THE DRAWINGS

An improved technique for full chip timing closure without iterations is described. The improved timing closure technique describes a new approach to full chip tasks. In the improved timing closure technique, to achieve full chip timing closure in a single pass, the design software or user estimates the top level net delays upfront, before the block level hardening (i.e. layout). To estimate the top level net delays upfront, the full chip tasks must be completed before the block level tasks.

Figure 1:
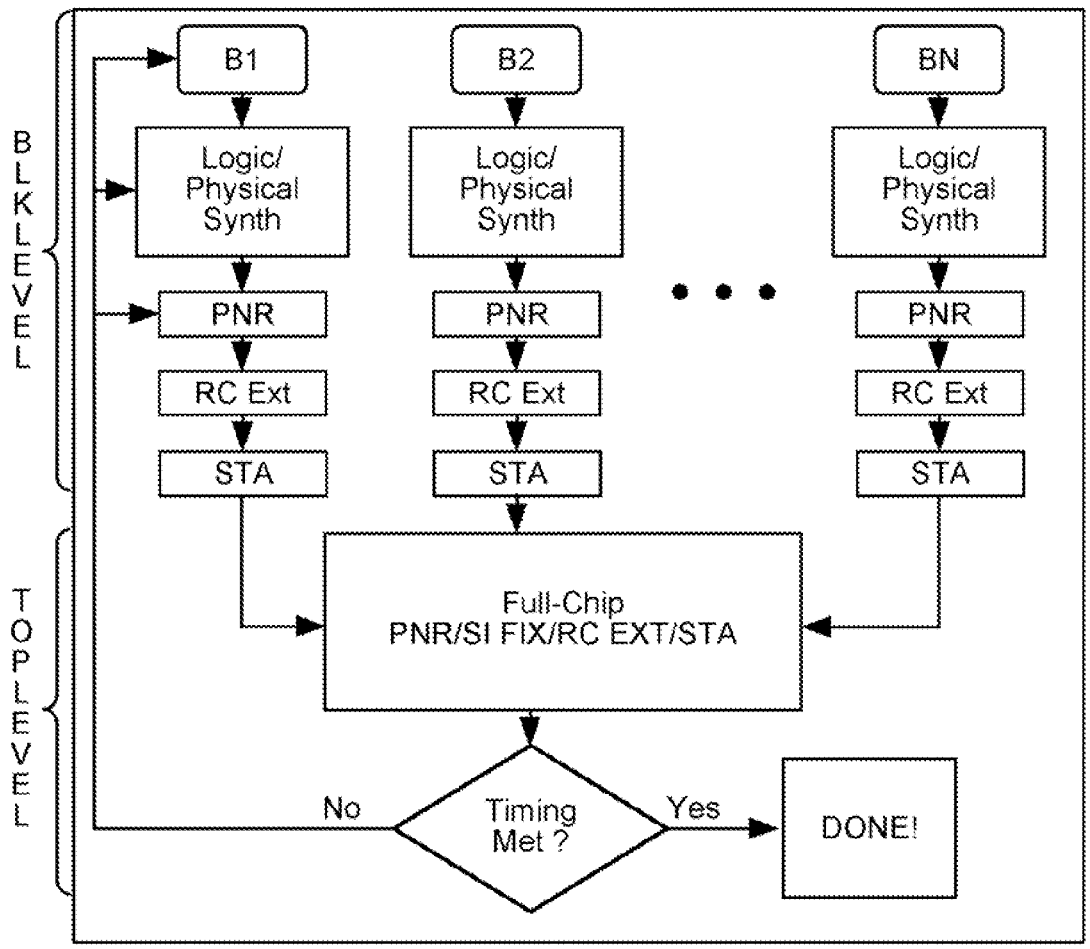
FIG. 1 is a conventional methodology for performing timing closure.
Figure 2:
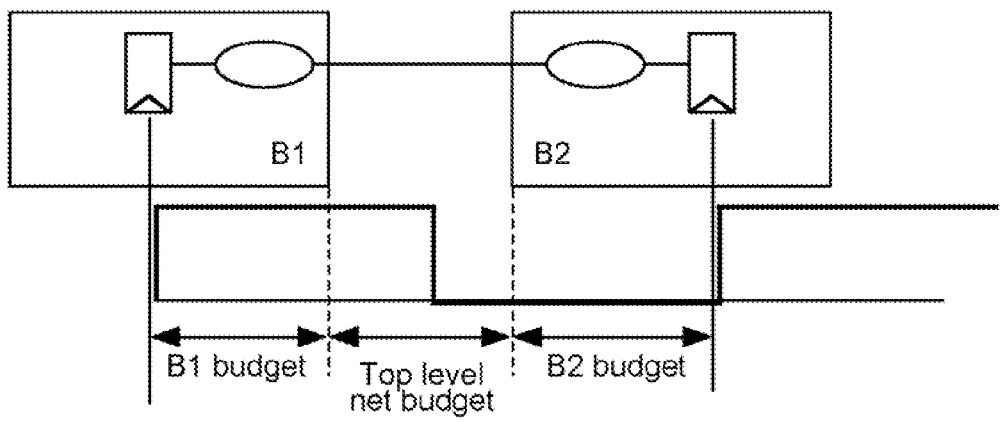
FIG. 2 shows a timing diagram of conventional delay budget for block level design.
Figure 3:
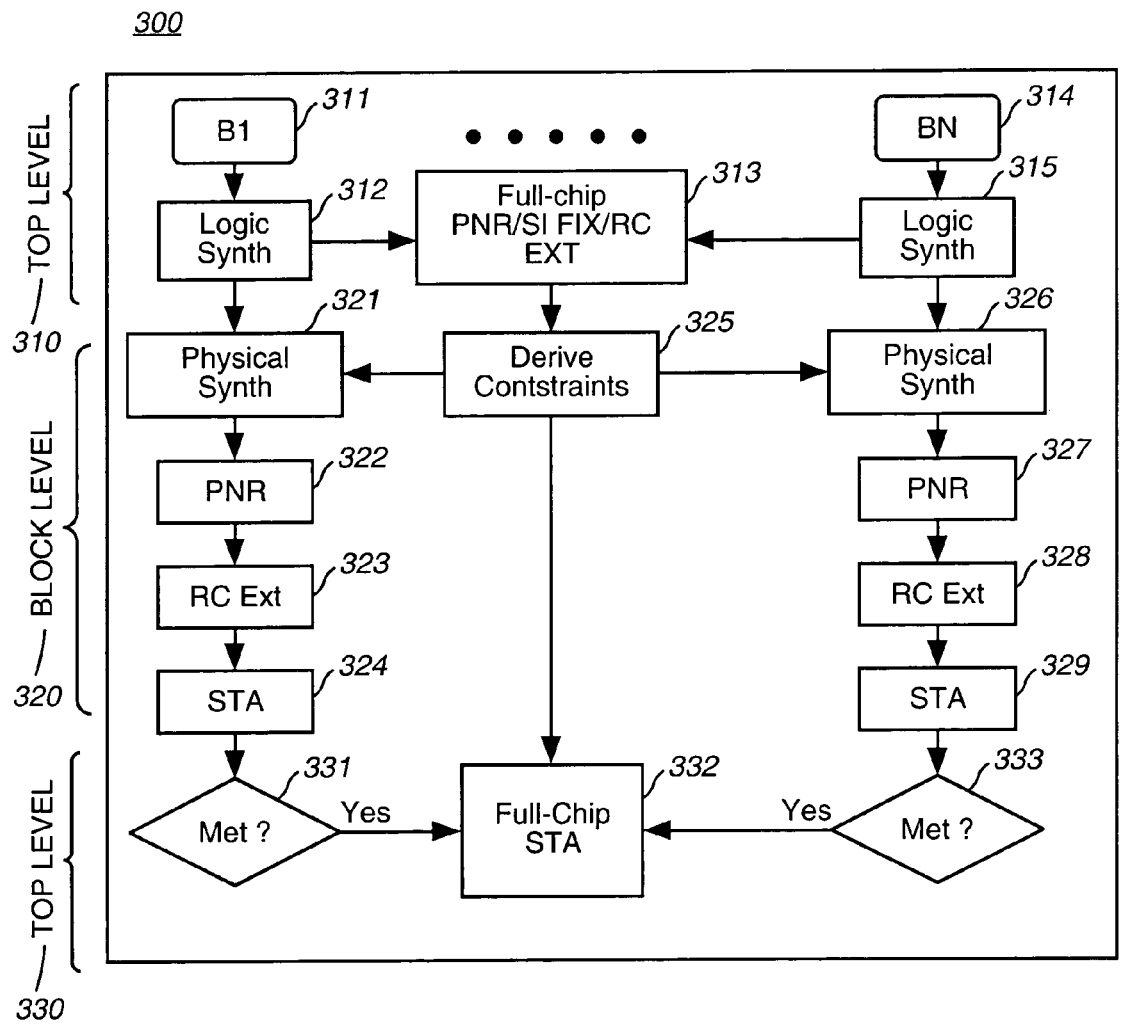
FIG. 3 shows an improved technique for full chip timing closure without iterations.

FIG. 3 illustrates the improved technique for full chip timing closure without iterations. The main characteristics of the improved technique are the top-down approach, whereby block level constraints are derived after top-level place and route (PNR). The improved technique can incorporate top level Signal Integrity (SI) fix and antenna fix delay push outs while deriving constraints. The design software or user performs block level activities using real derived constraints instead of assumed numbers, leading to full-chip timing closure without iterations. In this case, the B1 (subsystem block 1) and B2 (subsystem block 2) timing budgets (shown in FIG. 4) incorporate top level net delays accurately because top level routing is completed before block level physical synthesis and routing. Top level net delays are the delays caused by the signal passing through a trace(s) between two subsystem on the integrated circuit or chip. As a result, there are no iterations during full-chip Static Timing Analysis due to top level interconnect delays.

FIG. 3 shows a process 300 for performing static timing analysis (STA) on a chip. Static timing analysis is method of validating the timing performance of a chip by checking all possible paths (traces) for timing violations. This is commonly performed by a computer simulation of the chip. The process comprises a first top-level step 310, a block-level step 320, and a second top-level step 330. The first top-level step 310 comprises a plurality of blocks, block B1 (311) to block BN (314). These blocks 311, 314 are blocks of circuitry that commonly perform a specific function in the overall system of the integrated circuit. A logic synthesis operation 312 is performed on block 311, and the output of the logic synthesis is passed to a full chip PNR signal integrity (SI)fix and antenna fix delay operation (313) and to the block level step 320. Similarly, a second logic synthesis operation 315 is performed on block 314, and the output of the second logic synthesis is passed to full chip PNR signal integrity fix and antenna fix delay operation (313) and to the block level step 320. A logic synthesis is logic level simulation of the block. A signal integrity fix is fixing the electrical interaction between close traces that is likely to degrade a signal. The signal integrity fix ensures that despite interference between traces the signals are propagated across the traces properly. An antenna fix is a design methodology to prevent the accumulation of charge on traces that may damage the chip during the manufacturing process. However, an antenna fix may slow down the signal through a trace. These fixes may change the layout of traces and therefore the time it takes signals to propagate between points or systems. The output of the full chip PNR signal integrity fix and antenna fix delay operation 313 is passed to block level step 320.

The block-level step 320 includes a physical synthesis operation 321 performed on the output of logic synthesis operation 312 from block B1 (311). The physical synthesis operation also receives as an input an output from a derive constraints operation 325. The physical synthesis operation converts the logic level simulation into a physical level simulation for the subsystems or blocks. The derive constraints operation 325 receives as an input the output of full chip PNR signal integrity fix and antenna fix delay operation 313. The derive constraints operation examines the signal propagation delays on the top level net and devices the exact top level net delay 401 shown in FIG. 4. The output of the physical synthesis operation is passed into a place and route (PNR) operation 322. The output of the place and route operation 322 is passed to a resistance-capacitance extraction operation 323. The resistance and capacitance extraction operation is similar to the antenna fix operation discussed above. The output of the resistance-capacitance extraction operation 323 is passed to a static timing analysis (STA) operation 324. The output of the static timing analysis (STA) operation 324 is passed to a second top-level step 330.

The block level 320 further includes a second physical synthesis operation 326 performed on the output of second logic synthesis operation 315. The second physical synthesis operation also receives as an input an output from a derive constraints operation 325. The output of the physical synthesis operation is passed into a second place and route (PNR) operation 327. The output of the second place and route operation 327 is passed to a second resistance capacitance extraction operation 328. The output of the second resistance-capacitance extraction operation 328 is passed to a second static timing analysis (STA) operation 329. The output of the second static timing analysis (STA) operation 329 is passed to a second top-level step 330.

The second top-level step 330 comprises a constraints met test 331, which received as input the output of static timing analysis operation 324, and provides an output to full chip static timing analysis block 332. Full chip static timing analysis block 332 also receives as input the output of derive constraints operation 325. The second top-level step 330 further comprises a second static timing analysis met test 333, which receives as input the output of second static timing analysis operation 329. The output of second static timing analysis met test 333 is provided as input to the full chip static timing analysis block 332. The full chip static timing analysis block 332 provides for full chip timing closure without iterations.

Figure 4:
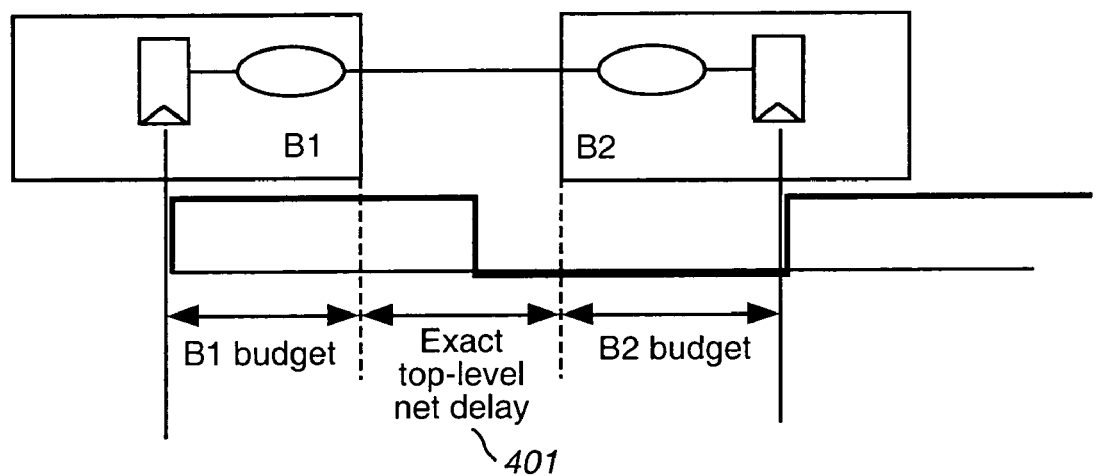
FIG. 4 shows a timing diagram of the improved delay budget for block level design with estimated interconnect delay.

Once the design software or user completes floor planning, the design software or user performs top level routing and estimates the interconnect delays, as shown in FIG. 4. It is also possible for the design software or user to do top level SI analysis/fixes and antenna fixes, before estimating the net delays. This helps to get more accurate estimation of the top-level net delays since top-level nets are potential candidates for cross-talk issues. With this, the design software or user can derive more robust timing constraints for the blocks. Then the design software or user runs through the flow for block hardening, and completes the block hardening for all the blocks. The design software or user integrates the full chip with all these blocks and timing analysis is complete. As there is no change in the full chip environment, the full chip timing closure is achieved in one pass without any iteration.

Figure 5:
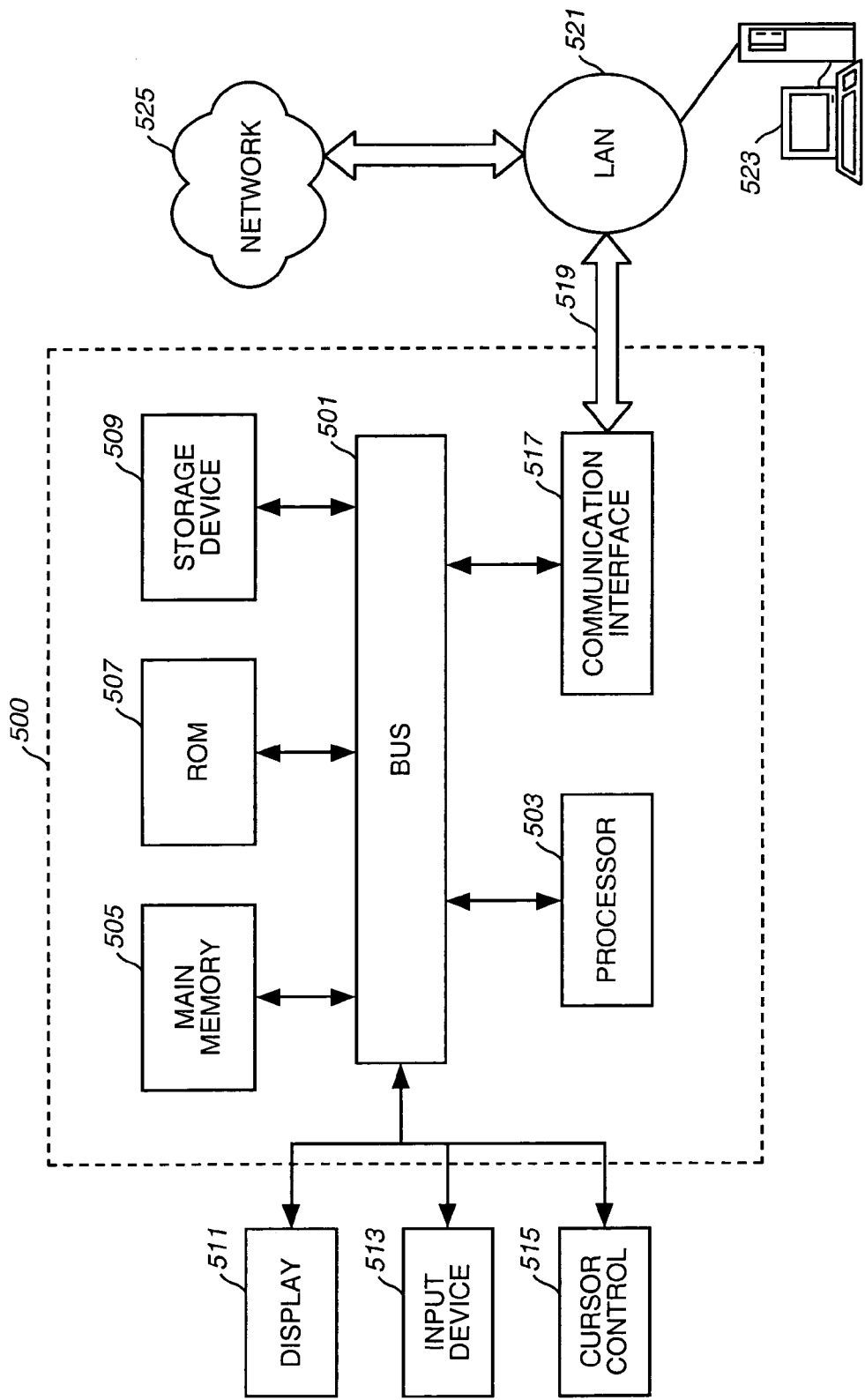
FIG. 5 shows a computer system on which the improved technique may be implemented.

Advantages of the improved method include that it avoids lengthy iterations at the block level for full chip timing closure, and achieves full chip timing closure in a single pass. Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium. FIG. 5 illustrates a computer system 500 upon which an embodiment according to the present invention can be implemented. The computer system 500 includes a bus 501 or other communication mechanism for communicating information and a processor 503 coupled to the bus 501 for processing information. The computer system 500 also includes main memory 505, such as a random access memory (RAM) or other dynamic storage device, coupled to the bus 501 for storing information and instructions to be executed by the processor 503. Main memory 505 can also be used for storing temporary variables or other intermediate information during execution of instructions by the processor 503. The computer system 500 may further include a read only memory (ROM) 507 or other static storage device coupled to the bus 501 for storing static information and instructions for the processor 503. A storage device 509, such as a magnetic disk or optical disk, is coupled to the bus 501 for persistently storing information and instructions.

The computer system 500 may be coupled via the bus 501 to a display 511, such as a cathode ray tube (CRT), liquid crystal display, active matrix display, or plasma display, for displaying information to a computer user. An input device 513, such as a keyboard including alphanumeric and other keys, is coupled to the bus 501 for communicating information and command selections to the processor 503. Another type of user input device is a cursor control 515, such as a mouse, a trackball, or cursor direction keys, for communicating direction information and command selections to the processor 503 and for controlling cursor movement on the display 511.

According to one embodiment of the invention, the improved method is provided by the computer system 500 in response to the processor 503 executing an arrangement of instructions contained in main memory 505. Such instructions can be read into main memory 505 from another computer-readable medium, such as the storage device 509. Execution of the arrangement of instructions contained in main memory 505 causes the processor 503 to perform the process steps described herein. One or more processors in a multi-processing arrangement may also be employed to execute the instructions contained in main memory 505. In alternative embodiments, hard-wired circuitry may be used in place of or in combination with software instructions to implement the embodiment of the present invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the present invention are not limited to any specific combination of hardware circuitry and software.

The computer system 500 also includes a communication interface 517 coupled to bus 501. The communication interface 517 provides a two-way data communication coupling to a network link 519 connected to a local network 521. For example, the communication interface 517 may be a digital subscriber line (DSL) card or modem, an integrated services digital network (ISDN) card, a cable modem, a telephone modem, or any other communication interface to provide a data communication connection to a corresponding type of communication line. As another example, communication interface 517 may be a local area network (LAN) card (e.g. for Ethernet™ or an Asynchronous Transfer Model (ATM) network) to provide a data communication connection to a compatible LAN. Wireless links can also be implemented. In any such implementation, communication interface 517 sends and receives electrical, electromagnetic, or optical signals that carry digital data streams representing various types of information. Further, the communication interface 517 can include peripheral interface devices, such as a Universal Serial Bus (USB) interface, a PCMCIA (Personal Computer Memory Card International Association) interface, etc. Although a single communication interface 517 is depicted in FIG. 5, multiple communication interfaces can also be employed. The network link 519 typically provides data communication through one or more networks to other data devices. For example, the network link 519 may provide a to connection through local network 521 to a host computer 523, which has connectivity to a network 525 (e.g. a wide area network (WAN) or the global packet data communication network now commonly referred to as the "Internet") or to data equipment operated by a service provider. The local network 521 and the network 525 both use electrical, electromagnetic, or optical signals to convey information and instructions. The signals through the various networks and the signals on the network link 519 and through the communication interface 517, which communicate digital data with the computer system 500, are exemplary forms of carrier waves bearing the information and instructions.

The computer system 500 can send messages and receive data, including program code, through the network(s), the network link 519, and the communication interface 517. In the Internet example, a server (not shown) might transmit requested code belonging to an application program for implementing an embodiment of the present invention through the network 525, the local network 521 and the communication interface 517. The processor 503 may execute the transmitted code while being received and/or store the code in the storage device 509, or other non-volatile storage for later execution. In this manner, the computer system 500 may obtain application code in the form of a carrier wave.

The term "computer-readable medium" as used herein refers to any medium that participates in providing instructions to the processor 505 for execution. Such a medium may take many forms, including but not limited to non-volatile media, volatile media, and transmission media. Non-volatile media include, for example, optical or magnetic disks, such as the storage device 509. Volatile media include dynamic memory, such as main memory 505. Transmission media include coaxial cables, copper wire and fiber optics, including the wires that comprise the bus 501. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor. For purposes of clarity, many of the details of the improved method and the methods of designing and manufacturing the same that are widely known and are not relevant to the present invention have been omitted from the following description. It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate claim.

What is claimed is:

1. A method of full semiconductor chip timing closure, comprising, in a semiconductor chip design system:
    a) determining system level place and route for a semiconductor chip, wherein the semiconductor chip comprises a plurality of subsystems;
    b) determining static timing analysis for each of the plurality of subsystems based upon the system level place and route; and
    c) performing a full chip static timing analysis to produce timing data, wherein full semiconductor chip timing closure is achieved in a single iteration.

2. The method of claim 1 wherein step (a) further includes a step of:
    a1) deriving a physical constraint between the plurality of subsystems.

3. The method of claim 1 wherein step (a) further includes a step of:
    a1) performing a signal integrity fix on the system level place and route.

4. The method of claim 1 wherein step (b) further includes a step of:
    b1) performing a subsystem level place and route for each of the plurality subsystems.

5. The method of claim 4, further including the step of:
    b2) determining a resistance-capacitance relationship between a plurality of traces based on the subsystems level place and route.

6. The method of claim 1, wherein step (b) further includes the step of:
    b1) performing a physical synthesis of each of the plurality of subsystems.

7. The method of claim 1, wherein step (a) further includes the step of:
    a1) performing a logic synthesis for each of the plurality of subsystems.

8. A method of full semiconductor chip timing closure, comprising, in a semiconductor chip design system:
    a) performing a logic synthesis for each of a plurality of subsystems on a semiconductor chip;
    b) performing a system level place and route to generate top level net delays; and
    c) performing a subsystem level place and route based upon the top level net delays to produce timing data, wherein full semiconductor chip timing closure is achieved in a single iteration.

9. The method of claim 8, further including the steps of:
    d) performing a resistance-capacitance extraction process for a subsystem.

10. The method of claim 9, further including the step
    e) performing a subsystem static timing analysis.

11. The method of claim 8, wherein step (b) further includes the step of:
    b1) deriving an exact top level net delay between each of the plurality of subsystems.

12. The method of claim 11, wherein step (b1) further includes the step of:
    i) performing a system level signal integrity fix.

13. The method of claim 12, further including the step of:
    ii) performing a system level resistance-capacitance extraction process.

14. The method of claim 8, wherein step (c) further includes the step of:
    c1) performing a subsystem physical synthesis.

15. A method of full semiconductor chip timing closure, comprising, in a semiconductor chip design system:
    a) performing a system level place and route to generate top level net delays; and
    b) performing a subsystem level place and route based upon the top level net delays to produce timing data, wherein full semiconductor chip timing closure is achieved in a single iteration.

16. The method of claim 15, wherein step (a) further includes the step of:
    a1) performing a subsystem logic synthesis.

17. The method of claim 16, further including the step of:
    a2) performing a signal integrity fix.

18. The method of claim 15, wherein step (b) further includes the step of:
    b1) performing a subsystem physical synthesis.

19. The method of claim 18, further including the step of:
    b2) performing a static timing analysis.

20. The method of claim 15, further including the step of:
    c) determining if a full chip static timing analysis is met.

21. A system comprising a processor and a memory, wherein said memory comprises instructions that when executed on said system implement a method of full semiconductor chip timing closure, said method comprising:
    performing a logic synthesis for each of a plurality of subsystems on a semiconductor chip;
    performing a system level place and route to generate top level net delays; and
    performing a subsystem level place and route based upon the top level net delays, wherein full semiconductor chip timing closure is achieved in a single iteration.

22. The system of claim 21, wherein said method further comprises:
    performing a resistance-capacitance extraction process for a subsystem.

23. A system comprising a processor and a memory, wherein said memory comprises instructions that when executed on said system implement a method of full semiconductor chip timing closure, said method comprising:
    performing a system level place and route to generate top level net delays; and
    performing a subsystem level place and route based upon the top level net delays, wherein full semiconductor chip timing closure is achieved in a single iteration.

24. The system of claim 23, wherein said method further comprises:
    determining whether a full chip static timing analysis is met.

* * * * *